United States Patent [19]
Hsu

[11] Patent Number: 6,163,972
[45] Date of Patent: Dec. 26, 2000

[54] APPARATUS AND METHOD FOR CALIBRATING A WAFER BLADE

[75] Inventor: Y. M. Hsu, Hsin-Chu, Taiwan

[73] Assignee: Taiwan Semiconductor Manufacturing Co., Ltd., Hsinchu, Taiwan

[21] Appl. No.: 09/090,364

[22] Filed: Jun. 4, 1998

[51] Int. Cl.[7] .............................. G01M 19/00; G01C 9/02
[52] U.S. Cl. ................................................. 33/533; 33/303
[58] Field of Search ......................................... 33/533, 303

[56] References Cited

U.S. PATENT DOCUMENTS

| | | | |
|---|---|---|---|
| 4,566,192 | 1/1986 | Hankins et al. ....................... | 33/533 X |
| 5,454,170 | 10/1995 | Cook .................................... | 73/865.9 X |
| 5,557,855 | 9/1996 | Hwang .................................. | 33/533 X |
| 5,970,807 | 10/1999 | Hsu et al. ............................. | 73/865.9 |

*Primary Examiner*—Thomas P. Noland
*Attorney, Agent, or Firm*—Tung & Associates

[57] ABSTRACT

A calibration tool for calibrating the leveling and tilting of a wafer transporting blade and a method for using such tool are provided. The calibration tool is constructed by a body portion and a leg portion each having a surface that are provided with a multiplicity of calibration lines facing each other such that a two-dimensional calibration can be performed on a blade simultaneously by positioning the blade between the body portion and the leg portion. The capability of measuring a plane, i.e., leveling and tilting, simultaneously is a great benefit made possible by the present invention method and apparatus.

10 Claims, 1 Drawing Sheet

APPARATUS AND METHOD FOR CALIBRATING A WAFER BLADE

FIELD OF THE INVENTION

The present invention generally relates to an apparatus and a method for calibrating a blade and more particularly, relates to an apparatus and method for calibrating the leveling of a wafer transporting blade by a calibration block which is equipped with a multiplicity of calibration lines on a body portion and on a leg portion such that a longitudinal edge and a lateral edge of the blade can be calibrated simultaneously.

BACKGROUND OF THE INVENTION

In the fabrication of integrated circuit devices, an electronic substrate, such as a wafer must be processed in numerous processing steps, i.e., as many as several hundred processing steps. During each of the processing steps, a silicon wafer must be transported in and out of a specific process machine such as an etcher, a physical vapor deposition chamber, a chemical vapor deposition chamber, etc. Between the processing steps, a preprocessed wafer is stored in a storage container called a wafer cassette. The wafer cassette is then stored in a container known as a pod to prevent contamination.

The wafer cassette is a device that is normally molded of a plastic material which can be used to store a large number of wafers in a horizontal position. In order to maximize the number of wafers that can be stored in a cassette, the wafers are positioned relatively close to each other. For instance, a pitch distance between the wafers is approximately 2 mm in a normal cassette. The wafers, when stored in the cassette are supported on their edges by molded-in supports on the interior walls of the cassette.

To load or unload a wafer into or out of a process machine or a wafer cassette, a device known as a wafer transporting blade, or a wafer blade is normally used. A wafer blade is a piece of thin metal plate that is normally formed in a rectangular shape. For instance, for loading and unloading an 8 inch wafer having a diameter of 200 mm, a wafer blade that is 150 mm long and 70 mm wide is normally used. The wafer blade is equipped with a handle portion for connecting to a robotic arm. A typical processing equipment that utilizes a wafer blade for loading or unloading wafers is one such as that manufactured by the Applied Materials Corp. of Santa Clara, Calif. In a P5000® main frame etcher, load lock chambers equipped with wafer blades are used to transport wafers into and out of various etch chambers. The chambers are used for etching of polysilicon, oxide or metal layers.

A wafer blade, when first installed, is in a perfectly flat and level condition and there is no warpage or bend in the blade. However, after repeated usage, the blade may become warped or otherwise deformed which may cause serious processing problems. When a blade, which is normally about 0.5 mm thick, is used to pick up a wafer from a wafer cassette that has only a 2 mm clearance from its neighboring wafers, a warpage or bend in the wafer blade may cause severe damage to the wafers, i.e., scratching in the surface or even breakage of the wafers. Since a wafer blade is controlled by a robotic arm which is programmed assuming that the blade is perfectly flat and leveled, even a small deviation from flatness or levelness may cause severe damage to the wafers. A reliable method for measuring the flatness or the leveling of a wafer transporting blade is therefore an important step in a preventive maintenance procedure conducted in a process machine.

Conventionally, a linear variable displacement transducer (LVDT) type of measuring device or a straight ruler are used for measuring the flatness or a deviation from a horizontal plane of the wafer blade. These types of measurement methods are not only inaccurate but also inconvenient to use when the wafer blade is normally positioned in a limited space. Moreover, a LVDT type measuring device is only capable of measuring the relative positioning of the blade, and not an absolute reading which is more desirable. A LVDT type measuring device or a straight ruler must be moved from point to point on a wafer blade and therefore there is no common reference point which can be used for obtaining an absolute reading. As a result, only a line may be established between the points and not a two-dimensional plane which is more desirable in indicating the flatness of a wafer blade.

It is therefore an object of the present invention to provide an apparatus and a method for measuring the leveling of a blade that does not have the drawbacks or shortcomings of the conventional apparatus or method.

It is another object of the present invention to provide an apparatus for measuring the leveling of a blade that is capable of providing a two-dimensional measurement in a plane.

It is a further object of the present invention to provide an apparatus for measuring the leveling and tilting of a blade that is capable of making a two-directional calibration in both a longitudinal and a lateral direction, simultaneously.

It is another further object of the present invention to provide an apparatus for calibrating the leveling and tilting of a wafer transporting blade that can be used to measure the blade in both a length direction and a width direction, simultaneously.

It is still another object of the present invention to provide an apparatus for calibrating the leveling of a wafer transporting blade which can be advantageously used in a limited space in which the blade operates.

It is yet another object of the present invention to provide an apparatus for calibrating the leveling of a wafer transporting blade wherein a two-dimensional calibration of a plane of the blade can be made.

It is still another further object of the present invention to provide a method for calibrating the leveling of a wafer transporting blade by first measuring the deviation on measuring scales provided on a calibration block and then correcting any deviations from the measuring scales.

It is yet another further object of the present invention to provide an apparatus for calibrating the leveling of a wafer transporting blade wherein the apparatus is equipped with a body portion and a leg portion which are spaced apart at a distance slightly larger than a width of the wafer transporting blade.

SUMMARY OF THE INVENTION

In accordance with the present invention a calibration tool for calibrating the leveling of a blade and a method for using such tool are provided.

In a preferred embodiment, a tool for calibrating the leveling of a blade is provided which includes a body portion that has a rectangular configuration including two extended surfaces of a first inner surface and an outer surface joined together by four side surfaces, the first inner surface has a first multiplicity of straight lines marked thereon parallel with a bottom edge of the first inner surface and has a preset spacing between the straight lines approximates that of a smallest division readable by human eyes, and a leg portion unitarily connected to and extending first outwardly from the first inner surface forming a horizontal section and then downwardly to a bottom surface that is on the same plane with a bottom surface of the body portion forming a vertical section, the leg portion has a second inner surface connecting perpendicularly to the first inner surface of the body portion, the second inner surface is marked on the vertical section a second multiplicity of straight lines parallel with a bottom surface of the vertical section of the leg portion, the second multiplicity of straight lines are marked to the same scale as the first multiplicity of straight lines.

The second multiplicity of straight lines can be marked to the same scale and corresponding to the same zero line of the first multiplicity of straight lines provided on the first inner surface. The blade calibrated may be a wafer transporting blade, or a wafer loading/unloading blade for a wafer cassette. The first and the second multiplicity of straight lines may be scribed or printed onto the first and second inner surfaces, respectively. The calibration tool can be made of a metallic material including aluminum or stainless steel. The preset spacing between the straight lines may be 0.5 mm, and should not be larger than 1 mm. The top surface of the body portion is normally on the same plane with a top surface of the leg portion. The tool may have a contour of an upside down U when viewed in a front view.

In another preferred embodiment, a calibration block for measuring the leveling of a wafer transporting blade is provided which includes a body portion and a leg portion unitarily connected together, the body portion generally has a rectangular configuration and a leg portion generally has a horizontal section extending from the body portion and a vertical section extending from the horizontal section having a bottom surface on the same plane with a bottom surface of the body portion, a first multiplicity of straight lines marked on a first inner surface on and parallel with the bottom surface of the body portion, and a second multiplicity of straight lines marked on a second inner surface on and parallel with the bottom surface of the vertical section of the leg portion, the second inner surface intercepts the first inner surface perpendicularly, the first and second multiplicity of straight lines have a preset spacing between two adjacent lines approximates that of a smallest division that is readable by human eyes.

The second multiplicity of straight lines may be marked to the same scale and corresponds to the same zero line of the first multiplicity of straight lines provide on the first inner surface. The wafer transporting blade calibrated may be a wafer loading/unloading blade for use in a wafer cassette. The first and the second multiplicities of straight lines may be scribed or printed onto the first and second inner surfaces, respectively.

The present invention is further directed to a method for calibrating the leveling and tilting of a wafer transporting blade which can be carried out by the operating steps of first providing a calibration block that has a body portion and a leg portion unitarily connected together, the body portion generally has a rectangular configuration and the leg portion generally has a horizontal section extending from the body portion and a vertical section extending from the horizontal section that has a bottom surface on the same plane with a bottom surface of the body portion, a first multiplicity of straight lines marked on a first inner surface on and parallel with the bottom surface of the body portion, and a second multiplicity of straight lines marked on a second inner surface on and parallel with the bottom surface of the vertical section of the leg portion, the second inner surface intercepts the first inner surface perpendicularly, while the first and second multiplicities of straight lines have a preset spacing between two adjacent lines that is substantially that of a smallest division readable by human eyes, then providing a wafer transporting blade which has a rectangular configuration, a first blade edge in a direction of a length and a second blade edge in a direction of a width, the length is larger than the width, then positioning the wafer transporting blade between the body portion and the leg portion of the calibration block, then measuring a first deviation between the first blade edge and a first line in the first multiplicity of straight lines on the body portion, and then measuring a second deviation between the second blade edge and a second line in the second multiplicity of straight lines on the leg portion, the first line and the second line have the same scale as measured from a zero line at the bottom surface of the body portion and the leg portion, respectively.

The method for calibrating the leveling and tilting of a wafer transporting blade may further include the steps of deforming the first blade edge and the second blade edge until the first deviation and the second deviation become zero. The method may further include the step of setting the preset spacing between the straight lines to not larger than 1 mm, and preferably to about 0.5 mm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention discloses an apparatus and a method for calibrating the leveling of a blade which can be used on any flat blade, but is particularly suitable for calibrating the leveling and tilting of a wafer transporting blade in a rectangular shape.

The present invention novel apparatus provides the unique benefit of being able to calibrate a plane of the wafer blade, i.e., in a longitudinal direction and in a lateral direction simultaneously. This is a great advantage over the conventional method of using a measuring device such as a LVDT type measuring scale or a straight ruler where only a one dimensional measurement can be made. The present invention apparatus enables a two-dimensional measurement to be made on a plane of a wafer blade simultaneously by visual examination. Furthermore, the present invention calibration tool can be easily used in a limited space in which a wafer blade normally operates. The ability of measuring a plane eliminates the uncertainty of point measurements wherein only a relative distance from a blade surface can be obtained without a fixed reference point. The present invention two-dimensional measurement technique enables an absolute distance or deviation from flatness on a plane of the wafer blade to be obtained. A correction of such deviation due to a warpage or bend in the blade can then be carried out by deforming the blade to its original shape. The present invention novel method can therefore be easily used to correct the bending or warpage in a wafer transporting blade.

The calibration block of the present invention can be easily fabricated of a metallic material such as aluminum or stainless steel. The calibration block is normally custom made to he specific dimensions of a wafer transporting blade. For instance, for a wafer blade used in transporting 200 mm diameter wafers, the blade may have a length of about 150 mm and a width of about 70 mm. The calibration block is fabricated such that the distance between a body portion and a leg portion is slightly larger than 70 mm to allow a direct reading of deviations from flatness in both the longitudinal direction and the lateral direction, simultaneously.

Instead of a visual reading of deviations from flatness or leveling, the present invention novel apparatus may further be equipped with electronic sensing means such as proximity sensors or capacitor sensors. In such applications, the electronic sensing devices may be installed in the surface of a calibration block at locations that are immediately adjacent to a wafer blade that is being measured. The electronic sensing device may provide more accurate readings than that possible from visual examination by human eyes. The accuracy of the measurement may thus be improved.

Figure 1:
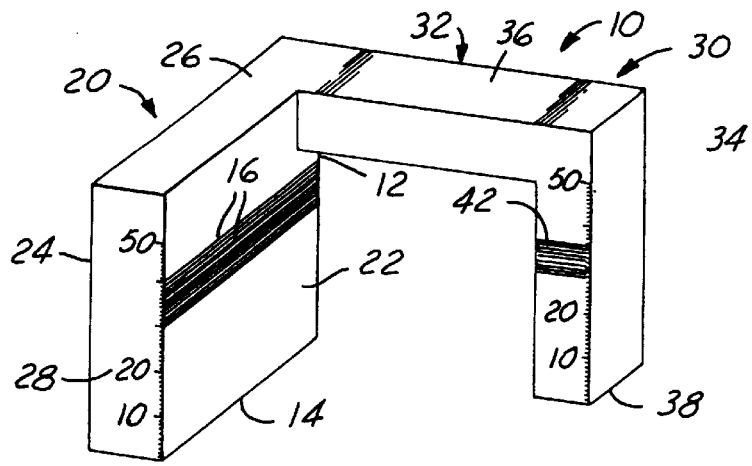
FIG. 1 is a perspective view of the present invention apparatus of a calibration block consisting of a body portion and a leg portion.

A perspective view of a present invention calibration block 10 is shown in FIG. 1. In the calibration block 10, a body portion 20 and a leg portion 30 are provided. The body portion 20 can be provided in a configuration of a rectangular shaped plate that has two extended surfaces of an inner surface 22 and an outer surface 24. The two opposing surfaces 22, 24 are joined by four side surfaces of a top surface 26, a front side surface 28, a back side surface 12 and a bottom surface 14. The thickness of the rectangular-shaped plate of the body portion 20 can be suitably selected for each specific application. The thickness should be selected such that it provides sufficient rigidity for the calibration block so that reliable measurement can be made each time it is used and yet, should be small enough such that it can be used in a limited space.

On an inner surface 22 of the body portion 20, a multiplicity of straight lines 16 are provided representing a measuring scale for determining the deviation of a blade from flatness or leveling. A more complete showing of the scale 16 is shown in FIG. 1B in a right-side view of the calibration block 10. It should be noted that while a measuring scale divided in 0 to 50 mm is illustrated in FIG. 1B, the scale can be marked in any measuring units as long as the smallest division can be read by human eyes. A suitable spacing between two immediately adjacent lines was found to be about 0.5 mm, and generally should be smaller than 1 mm.

The leg portion 30 is normally formed by extending outwardly from the inner surface 22 of the body portion 26 to form a horizontal section 32 and then extending downwardly from the horizontal section 32 into a vertical section 34 stopping at a length such that a bottom surface 38 of the vertical section 34 is on the same plane as the bottom surface 14 of the body portion 20. This is shown in FIG. 1B. It should be noted that in the specific embodiment shown in FIG. 1, the top surface 26 of the body portion 20 and the top surface 36 of the leg portion 30 are on the same plane. This may not be necessary as long as the height of the vertical section 34 is sufficiently such that the same scale as shown by the second multiplicity of straight lines 42 can be provided thereon to correspond to the first multiplicity of straight lines 16 on the body portion 20. For ease of fabrication, a coplanar structure of the top surface of the body portion and the top surface of the leg portion is more preferred.

Figure 1A:
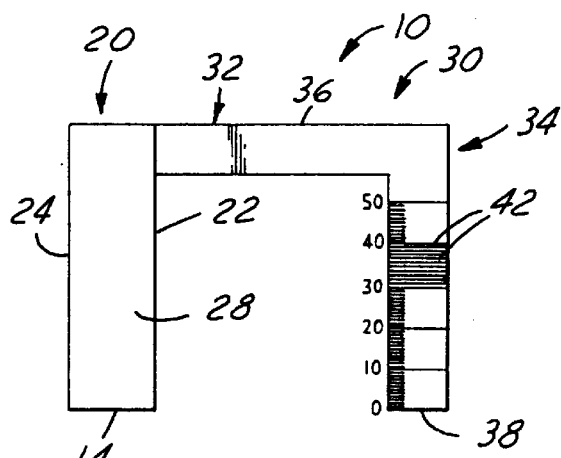
FIG. 1A is a front view of the present invention calibration block showing a multiplicity of straight lines in a measuring scale on a front surface of the leg portion.
Figure 1B:
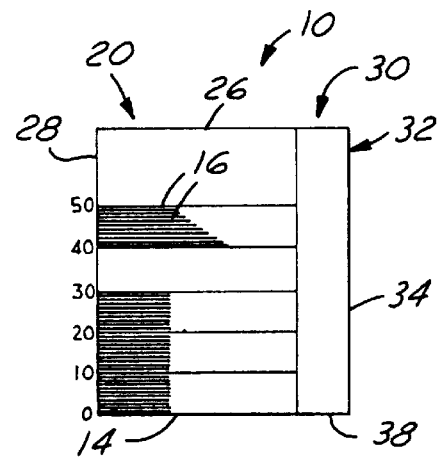
FIG. 1B is a right-side view of the present invention apparatus of the calibration block showing a multiplicity of straight lines in measuring scales on an inner surface of the body portion of the block.

An enlarged view of the second multiplicity of straight line 42 in the measuring scale corresponding to the first multiplicity of straight lines 16 is shown in FIG. 1A which is a front view of the present invention calibration block 10. The multiplicity of straight lines 16 or 42 can be provided by either printing onto or scribing into the material of the calibration block 10. When a soft metal such as aluminum is used in building the calibration block 10, scribing the measuring scale into the block is a more preferred method.

Figure 2:
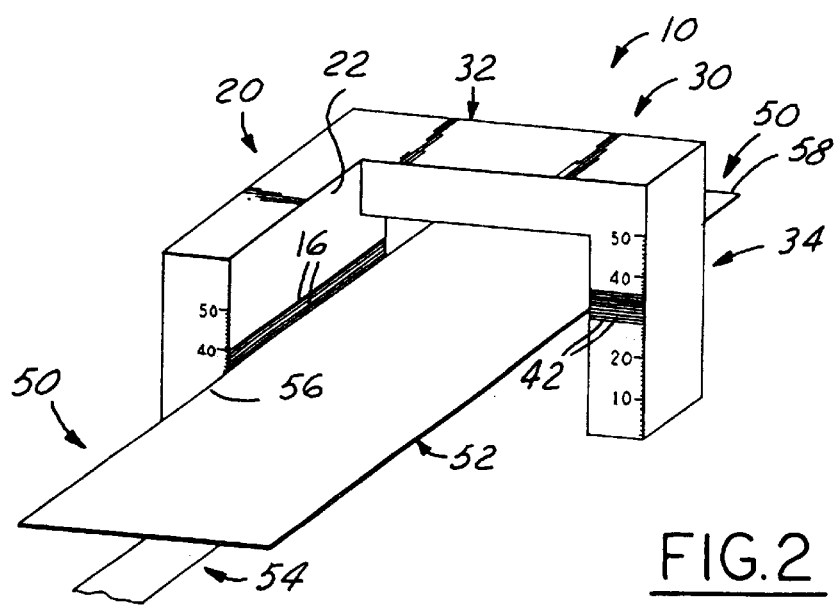
FIG. 2 is a perspective view illustrating a method utilizing the present invention calibration block by positioning a wafer transporting blade between a body portion and a leg portion of the block and measuring the deviation from the straight lines.

In practicing the present invention novel method for calibrating the leveling of a wafer transporting blade, the method can be described in the following steps and by inspecting a perspective view of a wafer transporting blade 50 positioned in a calibration block 10, as shown in FIG. 2. As shown in FIG. 2, the wafer transporting blade 50 is constructed by a blade portion 52 and a handle portion 54. The handle portion 54 is engaged by a robotic arm (not shown) and operated by a microprocessor equipped in the process machine. The blade portion 52 may have suitable dimensions of a width of about 70 mm and a length of about 150 mm when blade 52 is used for transporting wafers of 200 mm diameter. It should be noted that while the blade 50 shown in FIG. 2 appears to be flat, a blade after repeated usage is normally warped or bent such that a deviation from the multiplicity of straight lines 16 and 42 can be readily observed.

The advantages of the present invention novel method are obvious after an examination of FIG. 2. The wafer transporting blade 50 generally has a blade portion 52 that has a rectangular configuration, a first blade edge 56 in a length direction and a second blade edge 58 in a width direction. The length is normally larger than the width. After the wafer transporting blade 50 is positioned between the body portion 20 and the leg portion 30 of the calibration block 10, a first deviation between the first blade edge 56 and a line in the first multiplicity of straight lines 16 can be determined. By aligning the first blade edge 56 with a straight line on the inner surface 22, the flatness or the leveling of the first blade edge 56 can be readily determined. Any deviation from the straight line is an indication of a warpage in the first blade edge 56. Simultaneously with the determination of a deviation between the first blade edge 56 and the multiplicity of straight lines 16, the leveling of the blade portion 52 in the lateral direction can be determined by observing a deviation of the second blade edge 58 from the multiplicity of straight lines 42 located on the leg portion 30 of the calibration block 10. A deviation observed between a reading obtained from the first multiplicity of lines 16 and a reading obtained from the second multiplicity of lines 42 indicates a deviation from flatness in the lateral direction of the blade portion 52. The blade can then be bent back either by hand or by a machine to correct such warpage.

Similarly, if a tilt is detected in the blade portion 52 as indicated by a deviation in readings from the first multiplicity of straight lines 16 and the second multiplicity of straight lines 42, the motion of the robot arm can be corrected by inputting data into the microprocessor to correct the tilt. The present invention novel apparatus and method therefore allows a two-dimensional calibration of a wafer transporting blade simultaneously by using a single calibration tool. It has been found that in most IC fabrication equipment, when the preset spacing between two immediately adjacent lines is set at 0.5 mm, the precision of measurement by visual examination is adequate for calibrating a wafer transporting blade for use in a wafer cassette.

In future wafer cassette designs wherein the wafers may be positioned even closer together in order to maximize storage efficiency such that a more accurate calibration of the wafer blade is required, the accuracy of the present invention novel method may further be improved by use of electronic sensors such as proximity sensors or capacitor sensors installed in the surface of a calibration block for achieving more accurate measurements.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A tool for calibrating the leveling of a blade comprising:
   a body portion having generally a rectangular configuration comprising two extended surfaces of a first inner surface and an outer surface joined together by four side surfaces, said first inner surface having a multiplicity or straight lines marked thereon parallel with a bottom edge of said first inner surface having a preset spacing between said straight lines not larger than 1 mm, and
   a leg portion unitarily connected to and extending first outwardly from said first inner surface forming a horizontal section and then downwardly to a bottom surface that is on the same plane with a bottom surface of said body portion, said leg portion having a second inner surface connecting perpendicularly to said first inner surface of the body portion, said second inner surface is marked on said vertical section with a second multiplicity of straight lines parallel with a bottom surface of said vertical section of the leg portion, said second multiplicity of straight lines being marked in the same scale as said first multiplicity of straight lines.

2. A tool for calibrating the leveling of a blade according to claim 1, wherein said second multiplicity of straight lines are marked in the same scale and corresponds to a same zero line of said first multiplicity of straight lines on said first inner surface.

3. A tool for calibrating the leveling of a blade according to claim 1, wherein the blade calibrated is a wafer transporting blade.

4. A tool for calibrating the leveling of a blade according to claim 1, wherein said blade calibrated is a wafer loading/unloading blade for a wafer cassette.

5. A tool for calibrating the leveling of a blade according to claim 1, wherein said first and second multiplicities of straight lines are scribed into said first and second inner surfaces, respectively.

6. A tool for calibrating the leveling of a blade according to claim 1, wherein said tool is made of a metallic material comprising aluminum and stainless steel.

7. A tool for calibrating the leveling of a blade according to claim 1, wherein said preset spacing between said straight lines is about 0.5 mm.

8. A tool for calibrating the leveling of a blade according to claim 1, wherein a top surface of said body portion is on the same plane with a top surface of said leg portion.

9. A tool for calibrating the leveling of a blade according to claim 1, wherein said tool having a contour of an upside-down U when viewed in a front view.

10. A tool for calibrating the leveling of a blade according to claim 1, wherein said tool is capable of calibrating the leveling and tilting of a blade simultaneously in two dimensions.

* * * * *